(12) United States Patent
Lin et al.

(10) Patent No.: US 8,932,921 B2
(45) Date of Patent: *Jan. 13, 2015

(54) N/P METAL CRYSTAL ORIENTATION FOR HIGH-K METAL GATE VT MODULATION

(71) Applicant: Taiwan Semiconductor Manufacturing Company, Ltd., Hsin-Chu (TW)

(72) Inventors: Su-Horng Lin, Hsinchu (TW); Chi-Ming Yang, Hsinchu (TW); Chyi Shyuan Chern, Taipei (TW); Chin-Hsiang Lin, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/174,689

(22) Filed: Feb. 6, 2014

(65) Prior Publication Data

US 2014/0154848 A1    Jun. 5, 2014

Related U.S. Application Data

(62) Division of application No. 12/332,057, filed on Dec. 10, 2008, now Pat. No. 8,674,451.

(51) Int. Cl.
*H01L 21/8238* (2006.01)
*H01L 21/28* (2006.01)
*H01L 27/092* (2006.01)
*H01L 29/49* (2006.01)

(52) U.S. Cl.
CPC .. *H01L 21/823857* (2013.01); *H01L 21/28079* (2013.01); *H01L 21/823842* (2013.01); *H01L 27/0922* (2013.01); *H01L 29/4958* (2013.01)
USPC .......................................... 438/199; 257/369

(58) Field of Classification Search
USPC .......................................... 438/199; 257/369
See application file for complete search history.

(56) References Cited

U.S. PATENT DOCUMENTS

| | | | |
|---|---|---|---|
| 6,271,573 | B1 | 8/2001 | Suguro |
| 7,045,406 | B2 | 5/2006 | Huotari et al. |
| 7,105,891 | B2 | 9/2006 | Visokay et al. |
| 7,126,183 | B2 | 10/2006 | Forbes et al. |
| 2006/0192258 | A1* | 8/2006 | Tsuchiya et al. ............... 257/412 |
| 2007/0145493 | A1* | 6/2007 | Koyama et al. ............... 257/385 |
| 2008/0067607 | A1* | 3/2008 | Verhulst et al. ............... 257/371 |
| 2008/0135944 | A1 | 6/2008 | Ichihara et al. |

\* cited by examiner

*Primary Examiner* — Zandra Smith
*Assistant Examiner* — Jamie C Niesz
(74) *Attorney, Agent, or Firm* — Haynes and Boone, LLP

(57) ABSTRACT

The present disclosure provides an integrated circuit. The integrated circuit includes a semiconductor substrate having a first region and a second region; a first gate stack of an n-type field-effect transistor (FET) in the first region; and a second gate stack of a p-type FET in the second region. The first gate stack includes a high k dielectric layer on the semiconductor substrate, a first crystalline metal layer in a first orientation on the high k dielectric layer, and a conductive material layer on the first crystalline metal layer. The second gate stack includes the high k dielectric layer on the semiconductor substrate, a second crystalline metal layer in a second orientation on the high k dielectric layer, and the conductive material layer on the second crystalline metal layer.

19 Claims, 1 Drawing Sheet

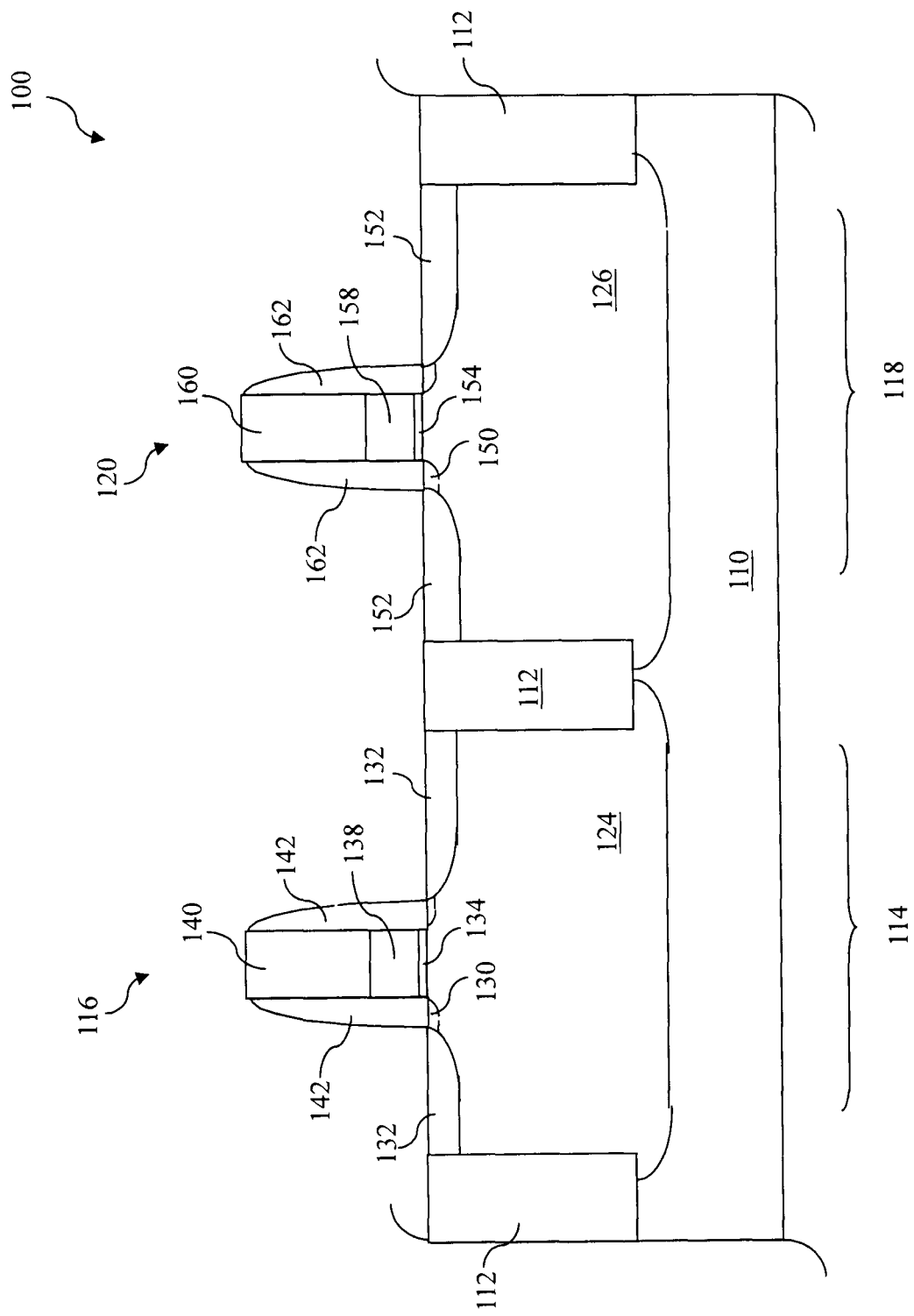

N/P METAL CRYSTAL ORIENTATION FOR HIGH-K METAL GATE VT MODULATION

PRIORITY DATA

This application is a divisional of U.S. application Ser. No. 12/332,057, filed on Dec. 10, 2008, entitled "N/P METAL CRYSTAL ORIENTATION FOR HIGH-K METAL GATE Vt MODULATION," the entirety of which is hereby incorporated by reference.

BACKGROUND

High k dielectric material and metal are adopted to form a gate stack when an integrated semiconductor device is scaled down to smaller device features through various technology nodes. In an integrated circuit with field-effect transistors (FETs), such as a metal-oxide-transistor (MOS), the threshold voltages for both p-type MOS (PMOS) transistors and n-type MOS (NMOS) transistors need to be adjusted, respectively for the device speed and performance characteristics. However, a doping process used to adjust the threshold voltages has limited effect when the feature size of the transistors is scaled down. What is needed is a device structure and a method of making the structure such that the work functions can be tuned independently and cost-effectively.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Particularly, FIG. 1 is a sectional view of one embodiment of an integrated circuit having metal gate stacks constructed according to various aspects of the present disclosure.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a sectional view of an integrated circuit 100 having metal gate stacks constructed according to one or more embodiments. The integrated circuit 100 and the method of making the same are collectively described with reference to FIG. 1.

The integrated circuit 100 includes a semiconductor substrate 110. The semiconductor substrate 110 includes silicon. Alternatively or additionally, the semiconductor substrate includes germanium, silicon germanium, silicon carbide or other suitable semiconductor materials. The integrated circuit also includes various isolation features 112, such as shallow trench isolation (STI), formed in the semiconductor substrate to separate various devices. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The substrate 110 includes a first region 114 for an n-type field effect transistors (nFET) 116 and a second region 118 for a p-type FET (pFET) 120. The semiconductor substrate 110 also includes various doped regions such as n-wells and p-wells, formed in various steps by one ore doping methods, such as ion implantation, diffusion, or other suitable techniques. In one embodiment, the first region 114 includes a p-well 124. In another embodiment, the second region 118 includes an n-well 126.

The nFET 116 includes a source and a drain, such as a lightly doped drain (LDD) features 130 and heavy doped source and drain 132 formed by ion implantation processes. A channel is defined in the substrate between the LDD features 130. The nFET 116 includes a metal gate stack having a gate dielectric layer and a gate electrode. The gate dielectric includes a high k dielectric material layer 134 formed on the semiconductor substrate. In one embodiment, the high k dielectric layer 134 includes hafnium oxide (HfO). In another embodiment, the high k dielectric material includes Al2O3. Alternatively, the high k dielectric material layer includes metal nitrides, metal silicates, other metal oxides or other suitable dielectric film. For example, the high k dielectric layer may include a metal oxide, such as ZrO2. In one embodiment, the high k dielectric layer is formed by atomic layer deposition (ALD). In other embodiments, the high k dielectric layer may be alternatively formed by metal organic chemical vapor deposition (MOCVD), physical vapor deposition (PVD), Molecular beam epitaxy (MBE), UV-ozone oxidation or other suitable techniques. In UV ozone oxidation method, a metal film is formed by sputtering and then the metal film is in-situ oxidized to metal oxide in presence of oxygen and UV light.

Additionally, an interfacial layer (not shown) may be interposed between the semiconductor substrate and the high k dielectric layer. In one example, the interfacial layer include silicon oxide and may be formed by various suitable methods, such as thermal oxidation, ALD or UV-Ozone Oxidation. In another example, the interfacial silicon oxide layer may have a thickness less than 10 A.

The gate stack for the nFET may additionally include a capping layer (not shown) interposed between the high k dielectric material layer and the gate electrode. In one embodiment, the capping layer includes lanthanum oxide (LaO). The capping layer may alternatively other suitable material.

The gate electrode includes a first crystalline metal layer 138 in a first orientation. The first crystalline metal and first orientation are chosen such that the first crystalline metal layer has a first work function close to the silicon conduction band energy (Ec) or lower work function, presenting easier electron escape. For example, the first work function is about 4.2 eV or less. Preferably, the first crystalline metal layer is oriented to have a loose surface orientation with a smaller density on the surface parallel to the semiconductor substrate. In one embodiment, the first orientation is chosen as {100} in Miller indices. In this notation, the Miller index {100} represents a crystalline plane of the first crystalline metal layer parallel to the semiconductor substrate surface. In one embodiment, the first crystalline metal layer includes tantalum. In other embodiments, the first crystalline metal includes lanthanum, hafnium, zirconium, aluminum, or titanium. The first crystalline metal layer can be formed by a suitable technique. The crystalline orientation of the first crystalline metal layer can be controlled by the deposition technique and deposition condition.

In one embodiment, a PVD is used to form the first crystalline metal layer. For example, when tantalum (Ta) is employed to form the first crystalline metal layer with an orientation {100}, a PVD is implemented with a processing condition including a radio frequency (rf) power raging between about 100 watt (W) and about 1000 watt. In this case, an argon is used as inactive gas with a gas flow ranging between about 3 sccm and about 50 sccm. The deposition chamber may have a pressure about $2 \times 10^{-4}$ torr. In another embodiment, ruthenium (Ru) is used to form the first crystalline metal layer with the orientation {100}. PVD is implemented to form the {100} ruthenium layer. The sputtering temperature can be adjusted to form the {100} ruthenium layer. For example, the {100} ruthenium layer is formed by PVD at about 300 C of the sputtering temperature. In another example, the {100} ruthenium layer is formed by PVD with Ar+ energy of about 500 eV and incident angle of about 75°, and the current density greater than 1.2 A/m². In another example, the {100} ruthenium layer can be formed by PVD when the argon gas pressure is increased. In another embodiment, the {100} ruthenium layer can be formed by MOCVD at a deposition temperature of about 400 C or higher. In another embodiment, PtTiO is used for the first crystalline metal layer. The PtTiO crystalline layer with the orientation {100} can be formed by MOCVD when the deposition rate is adjusted to 2.5 nm/min or higher. In one embodiment, the first crystalline metal has a thickness ranging between about 10 angstrom and about 200 angstrom.

The gate electrode further includes a conductive material layer 140 formed on the first crystalline metal layer. The conductive material layer can include a metal, such as copper, aluminum or tungsten formed by PVD, CVD, plating or combinations thereof. Alternatively, the conductive material layer includes polysilicon formed by CVD.

The nFET 116 in the first region 114 may also include gate spacer 142 formed on the sidewalls of the metal gate stack. The gate spacers may have a multilayer structure and may include silicon oxide, silicon nitride, silicon oxynitride, or other dielectric material. In one embodiment, the gate spacer 142 is formed by deposition and dry etch.

The pFET 120 includes a source and a drain, such as a lightly doped drain (LDD) features 150 and heavy doped source and drain 152 formed by ion implantation processes. A channel is defined in the substrate between the LDD features 150. The pFET 120 includes a metal gate stack having a gate dielectric layer and a gate electrode. The gate dielectric of the pFET includes a high k dielectric material layer 154 formed on the semiconductor substrate. In one embodiment, the high k dielectric layer 154 is substantially similar to the high k dielectric layer 134 of the nFET 116 in terms of composition and formation. For example, the high k dielectric layers 134 and 154 are formed simultaneously in a same process. For another example, the high k dielectric layer 154 includes hafnium oxide (HfO). In another embodiment, the high k dielectric material layer 154 includes Al2O3. Alternatively, the high k dielectric material layer includes metal nitrides, metal silicates, other metal oxides or other suitable dielectric film. In another embodiment, the high k dielectric layer is formed by ALD. In other embodiments, the high k dielectric layer 154 may be alternatively formed by MOCVD, PVD, MBE, UV-ozone oxidation or other suitable techniques.

Additionally, an interfacial layer (not shown) may be interposed between the semiconductor substrate and the high k dielectric layer 154. In one example, the interfacial layer include silicon oxide and may be formed by various suitable methods, such as thermal oxidation, ALD or UV-Ozone Oxidation. In another example, the interfacial silicon oxide layer may have a thickness less than 10 A. In another embodiment, the interfacial layers in the first region and the second region are formed simultaneously in a same process.

The gate stack for the pFET may additionally include a capping layer (not shown) interposed between the high k dielectric material layer and the gate electrode. In one embodiment, the capping layer includes lanthanum oxide (LaO). The capping layer may alternatively other suitable material. In another embodiment, the capping layers in the first and second regions may be substantially similar in terms of composition and formation. The capping layers in the first and second regions may be formed simultaneously in one process.

The gate electrode of the pFET 120 includes a second crystalline metal layer 158 in a second orientation. The second crystalline metal and second orientation are chosen such that the second crystalline metal layer has a second work function close to the silicon valence band energy (Ev) or higher work function, presenting strong electron bonding energy to the nuclei. For example, the second work function is about 5.1 eV or higher. The second crystalline metal layer is oriented to have a tighten surface orientation with a higher density on the surface parallel to the semiconductor substrate. In one embodiment, the second orientation is chosen as {111} in Miller indices. In this notation, the Miller index {111} represents a crystalline plane of the second crystalline metal layer parallel to the semiconductor substrate surface. In one embodiment, the second crystalline metal layer includes platinum (Pt). In other embodiments, the second crystalline metal includes ruthenium, tungsten, nickel, or other suitable metal. The second crystalline metal layer can be formed by a suitable technique. The crystalline orientation of the second crystalline metal layer can be controlled by the deposition technique and deposition condition. In one embodiment, an e-gun evaporation is implemented to form the second crystalline metal layer. For example, when platinum is used to form the second crystalline metal layer with an orientation {111}, an e-gun evaporation is implemented with a processing condition including the e-gun evaporation temperature ranging between about 300 C and about 700 C. In another embodiment, ruthenium (Ru) is used to form the second crystalline metal layer with the orientation {111}. The {111} ruthenium layer can be formed by MOCVD at a deposition temperature of about 300 C or lower. In one embodiment, the second crystalline metal has a thickness ranging between about 10 angstrom and about 200 angstrom.

The gate electrode of the pFET further includes a conductive material layer 160 formed on the second crystalline metal layer. The conductive material layer can include a metal, such as copper, aluminum or tungsten formed by PVD, CVD, plating or combinations thereof. Alternatively, the conductive material layer includes doped polysilicon formed by CVD. In another embodiment, the conductive material layers 140 and 160 can be formed simultaneously in one step.

The nFET 120 in the second region 118 may also include gate spacer 162 formed on the sidewalls of the metal gate stack. The gate spacers 162 may have a multilayer structure and may include silicon oxide, silicon nitride, silicon oxynitride, or other dielectric material. In one embodiment, the gate spacer 162 is formed by deposition and dry etch. In another embodiment, the spacers 142 and 162 can be formed simultaneously in one step.

By the disclosed integrated circuit and the method of making the same, the work functions for the nFET and pFET may be tuned independently by choosing a first metal and a second metal, forming the first crystalline metal layer in the first orientation using the first metal and forming the second crystalline metal layer in the second orientation using the second metal. The crystalline orientation of the first and second crystalline metal layers can be controlled by adjusting the processing conditions as discussed above. In one example, the first crystalline metal layer 138 for the nFET is tuned to {100} and the second crystalline metal layer 158 for the pFET is tuned to {111}. Therefore, the disclosed structure can provide lower threshold voltages (Vt) for both nFET and pFET.

Although not shown, the integrated circuit 100 may include other features. For example, an inter-level dielectric (ILD) layer is formed on the semiconductor substrate and the gate stacks. A chemical mechanical polishing (CMP) process is applied to the integrated circuit to polish the ILD layer. Then, multilayer interconnection is formed on the semiconductor substrate ad configured to be coupled to various features, such the sources, drains, and gate electrodes of the nFET and pFET. The integrated circuit 100 may further include a bonding structure and a passivation structure formed on the multilayer interconnection. In another embodiment, the semiconductor substrate 110 may further include other semiconductor material formed by a selective epitaxy growth (SEG) for strained substrate and enhanced channel mobility. For example, the integrated circuit 100 includes silicon germanium (SiGe) formed in the source, drain and/or the channel areas of the pFET 120 in the second region 118. In another example, the integrated circuit 100 includes silicon carbide (SiC) formed in the source, drain and/or the channel areas of the nFET 116 in the first region 114.

In one embodiment, the integrated circuit 100 can be formed in a gate-first process flow. For example, the method may include forming the STI, forming p-wells and n-wells, depositing gate layers and patterning the gate layers to form gate stacks for the nFET and pFET; forming LDD features such that the LDD regions are aligned with the gate stacks; forming gate spacers; and forming heavy doped source and drain. In another embodiment, the integrated circuit 100 can be formed in a gate-last process flow. For example, the method may include forming the STI, forming p-wells and n-wells, depositing gate layers and patterning the gate layers to form dummy gate stacks for the nFET and pFET; forming LDD features such that the LDD regions are aligned with the dummy gate stacks; forming gate spacers; and forming heavy doped source and drain; then forming an ILD layer and applying a CMP process to polish the ILD layer to expose the dummy gate stacks, then partially remove the gate material layers to form gate trenches; then filling the gate conductive material layers or alternatively both gate metal layers and the gate conductive material layers; and followed by the process to form interconnection including metal lines and contacts/vias by a process such as a damascene process.

Although not shown or not fully described, other processing step may present to form various doped features and other devices features such as multilayer interconnection (MLI). In one example, the light doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. The n-type dopant impurities employed to form the associated doped regions may include phosphorus, arsenic, and/or other materials. The p-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The integrated circuit 100 in various embodiments and the methods of making the same may be used in other semiconductor devices having a high k and metal gate features, such as strained semiconductor substrate, a hetero-semiconductor device or a stress-free isolation structure.

The present disclosure is not limited to applications in which the semiconductor structure includes an nFET and pFET, such as metal-oxide-silicon (MOS) transistors, and may be extended to other integrated circuit having a metal gate stack. For example, the semiconductor structures may include a dynamic random access memory (DRAM) cell, a single electron transistor (SET), and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In another embodiment, the semiconductor substrate may include an epitaxial layer. For example, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the methods and devices disclosed herein may be implemented with a gate first process flow, a gate last process flow, or a hybrid process flow that includes both gate first and gate last process flows.

What is claimed is:

1. A method for fabricating a semiconductor device comprising:
   providing a semiconductor substrate having a first region and a second region;
   forming a high k dielectric layer on the semiconductor substrate;
   forming a first crystalline metal feature with a first orientation on the high k dielectric layer in the first region, wherein the first orientation is {100};
   forming a second crystalline metal feature with a second orientation on the high k dielectric layer in the second region, wherein the second orientation is {111};
   forming a first source and first drain in the semiconductor substrate in the first region, wherein the first source and first drain include n-type dopant and wherein the first crystalline pure metal feature is interposed between the first source and first drain; and
   forming a second source and second drain in the semiconductor substrate in the second region, wherein the second source and second drain include p-type dopant and wherein the second crystalline metal feature is interposed between the second source and second drain,
   wherein the first crystalline metal feature and second crystalline metal feature each includes ruthenium (Ru).

2. The method of claim 1, wherein the first crystalline metal feature is formed by a physical vapor deposition (PVD) process using a power ranging between about 100 W and about 1000 W, a pressure of about $2\times10^{-4}$ torr, and an argon gas flow ranging between about 3 sccm and about 50 sccm.

3. The method of claim 1, wherein the second crystalline metal feature is formed by an e-gun evaporation process using a deposition temperature ranging between about 300 C and about 700 C.

4. The method of claim 1, wherein the first crystalline metal feature is formed by one of:
   by PVD at about 300 C;
   by MOCVD at a deposition temperature exceeding about 400 C; and
   by PVD with Ar+ energy of about 500 eV and incident angle of about 75°, and the current density greater than 1.2 A/m².

5. The method of claim 1, wherein the second crystalline metal feature is formed by MOCVD at a deposition temperature not exceeding about 300 C.

6. A method for fabricating an integrated circuit, comprising:
   providing a semiconductor substrate having a first region and a second region;
   forming, in the first region, an n-type field-effect transistor (FET) having a first gate stack, wherein the forming includes:
      forming first gate spacers disposed on opposing sidewalls of the first gate stack;
      forming a high k dielectric layer disposed over the semiconductor substrate;
      forming a tantalum layer disposed over the high k dielectric layer, wherein the tantalum layer has a {100} orientation interfacing the high k dielectric layer; and
      forming a first conductive metal material layer disposed over and in physical contact with the tantalum layer, wherein all portions of the first conductive metal material layer are disposed between the first gate spacers; and
   forming, in the second region, a p-type FET having a second gate stack, wherein the forming includes:
      forming second gate spacers disposed on opposing sidewalls of the second gate stack;
      forming the high k dielectric layer over the semiconductor substrate;
      forming a platinum layer disposed over the high k dielectric material layer, wherein the platinum layer has a {111} orientation interfacing the high k dielectric layer; and
      forming a second conductive metal material layer disposed over and in physical contact with the platinum layer, wherein all portions of the second conductive metal material layer are disposed between the second gate spacers.

7. The method of claim 6, wherein the high k dielectric layer includes hafnium oxide.

8. The method of claim 6, wherein forming the tantalum layer includes utilizing a physical vapor deposition (PVD) process with a power ranging between about 100 W and about 1000 W, a pressure of about $2\times10^{-4}$ torr, and an argon gas flow ranging between about 3 sccm and about 50 sccm.

9. The method of claim 6, wherein forming the platinum layer includes utilizing an e-gun evaporation process with a deposition temperature ranging between about 300 C and about 700 C.

10. The method claim 6, wherein the first conductive metal material layer includes one of copper, aluminum, and tungsten.

11. The method of claim 6, wherein the first conductive metal material layer is free of silicide.

12. A method for fabricating an integrated circuit, comprising:
   providing a semiconductor substrate having a first region and a second region, the second region being adjacent to the first region;
   forming, in the first region, an n-type field-effect transistor (FET) having a first gate electrode, wherein the forming includes:
      forming a first channel region defined between a first source region and a first drain region;
      forming a first crystalline metal layer disposed over and in physical contact with a high k dielectric layer, the first crystalline metal layer having a {100} orientation; and
      forming a first conductive pure metal material layer disposed over and in physical contact with the first crystalline metal layer, the first conductive pure metal material layer being further disposed directly over the first channel region and being part of the first gate electrode; and forming a p-type FET in the second region having a second gate electrode, wherein the forming includes:
  forming a second channel region defined between a second source region and a second drain region;
  forming a second crystalline metal layer disposed over and in physical contact with the high k dielectric material layer, the second crystalline metal layer having a {111} orientation and being formed of a different metal than the first crystalline metal layer; and
  forming a second conductive pure metal material layer disposed over and in physical contact with the second crystalline metal layer, the second conductive pure metal material layer being further disposed directly over the second channel region and being part of the second gate electrode.

13. The method of claim 12, wherein the semiconductor substrate includes silicon.

14. The method of claim 12, the first crystalline metal layer includes tantalum (Ta).

15. The method of claim 12, wherein forming the first crystalline metal layer includes utilizing a physical vapor deposition (PVD) with a power ranging between about 100 W and about 1000 W, a pressure of about $2\times10^{-4}$ torr, and an argon gas flow ranging between about 3 and 50 sccm.

16. The method of claim 12, wherein the second crystalline metal layer includes platinum (Pt).

17. The method of claim 12, wherein forming the second crystalline metal layer includes utilizing e-gun evaporation with a temperature ranging between about 300 C and about 700 C.

18. The method of claim 12, wherein the first and second crystalline metal layers each include a different one of lanthanum (La), hafnium (Hf), ruthenium (Ru), zirconium (Zr), titanium (Ti), tantalum (Ta), tungsten (W), nickel (Ni) and platinum (Pt).

19. The method of claim 12, wherein the first crystalline metal layer includes PtTiO.

* * * * *